(12) United States Patent
Iwasaki et al.

(10) Patent No.: US 9,222,984 B2
(45) Date of Patent: Dec. 29, 2015

(54) POWER SUPPLYING SYSTEM FOR SUPPLYING POWER TO A LOAD DISPOSED IN A FACILITY

(75) Inventors: Toshiya Iwasaki, Moriguchi (JP); Jun Yamasaki, Moriguchi (JP); Yosuke Tanida, Moriguchi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 469 days.

(21) Appl. No.: 13/700,354

(22) PCT Filed: Jul. 29, 2011

(86) PCT No.: PCT/JP2011/067448
§ 371 (c)(1),
(2), (4) Date: Nov. 27, 2012

(87) PCT Pub. No.: WO2012/017942
PCT Pub. Date: Feb. 9, 2012

(65) Prior Publication Data
US 2013/0069659 A1  Mar. 21, 2013

(30) Foreign Application Priority Data
Aug. 5, 2010  (JP) .................... 2010-175922

(51) Int. Cl.
H01M 10/46  (2006.01)
G01R 31/36  (2006.01)
H02J 3/32  (2006.01)
H01M 10/42  (2006.01)
H01M 10/44  (2006.01)

(52) U.S. Cl.
CPC ........... G01R 31/3606 (2013.01); H01M 10/42 (2013.01); H01M 10/44 (2013.01); H02J 3/32 (2013.01)

(58) Field of Classification Search
CPC ...... H02J 7/0093; H02J 7/0073; H02J 7/0075
USPC ................. 320/107, 128, 130, 133, 149, 104; 324/426, 433
See application file for complete search history.

(56) References Cited

U.S. PATENT DOCUMENTS 5,283,511 A * 2/1994 Keener et al. ................. 320/106
6,100,666 A    8/2000 Ryu
2011/0125337 A1* 5/2011 Zavadsky et al. ............. 700/291

FOREIGN PATENT DOCUMENTS

| JP | 9-285024 A | 10/1997 |
| JP | 2000-060020 A | 2/2000 |
| JP | 2001-286075 A | 10/2001 |
| JP | 2006-287998 A | 10/2006 |

OTHER PUBLICATIONS

International Search Report issued in International Application No. PCT/JP2011/067448 issued on Oct. 12, 2011.

* cited by examiner

Primary Examiner — Edward Tso
(74) Attorney, Agent, or Firm — McDermott Will & Emery LLP (57) ABSTRACT

[Objective] To provide a power supplying system wherein the timing at which a storage unit conducts capacity learning is made to be more suitable. [Solution] A power supplying system supplies power to loads provided within a facility, and is provided with: a power storage unit that stores power by being charged, and supplies power by being discharged; and a capacity measurement unit that measures the remaining capacity of the power storage unit by executing a complete charging and a complete discharging of the power storage unit, in sequence. The capacity measurement unit obtains the operation schedule of the facility, and determines the timing at which the complete charging and the complete discharging of the power storage unit are to be conducted, on the basis of the operation schedule.

8 Claims, 5 Drawing Sheets

POWER SUPPLYING SYSTEM FOR SUPPLYING POWER TO A LOAD DISPOSED IN A FACILITY

RELATED APPLICATIONS

This application is the U.S. National Phase under 35 U.S.C. §371 of International Application No. PCT/JP2011/067448, filed on Jul. 29, 2011, which in turn claims the benefit of Japanese Application No. 2010-175922, filed on Aug. 5, 2010, the disclosures of which Applications are incorporated by reference herein.

TECHNICAL FIELD

The present invention relates to a power supplying system that supplies power.

BACKGROUND ART

In recent years, a power storage battery is going large, studied so as to be used to store power that is consumed in households, stores, buildings and the like. This power storage battery is able to perform a discharge (supply power) at any timing by being charged (consumes power) beforehand. In other words, by controlling the timing for performing the charge and discharge of the power storage battery, it becomes possible to control a timing when system power (power supplied form an electric power company) is consumed.

Generally, the power rate of system power includes a fixed basic rate and a measured use rate. And, an electric power company sets the power rate such that the basic rate becomes more inexpensive as the maximum value of system power amount consumed during a unit time becomes smaller. Besides, the power rate is set such that the use price per unit power becomes more inexpensive during a night when the power consumption is likely to become small than during a daytime when the power consumption is likely to become large. Because of this, a user of the system power can reduce payment of the power rate more as the power consumption is more leveled. And, if the power consumption is leveled, an electric company becomes able to efficiently perform the power generation (especially, thermal power generation), accordingly, it becomes possible to reduce the amount of carbon dioxide emission due to the power generation.

The leveling of the power consumption is achievable by, for example, discharging a power storage battery in a case where the power amount consumed per unit time becomes large instantaneously, or by charging the power storage battery during a night and discharging the power storage battery during a daytime. In the case of controlling such a charge and a discharge of the power storage battery, if a residual amount of the power storage battery is exactly measured to decide the timing for performing the charge and discharge and the power amount to be charged and discharged, it is possible to effectively achieve the leveling of the power consumption, which is accordingly preferable.

As methods for measuring the residual amount of the power storage battery, there are, for example: a method that estimates the residual amount based on a voltage value of the power storage battery; and a method that uses a state (e.g., a sufficiently charged state) as a reference and estimates the residual amount by integrating an amount of charged and discharged electric current. However, according to these methods, the estimation accuracy deteriorates because of use of the power storage battery and time passage, it becomes impossible to obtain the exact residual amount, which becomes a problem.

As a method for solving the problem, there is a method for performing a full charge and a full discharge of the power storage battery and obtaining again the residual amount of the power storage battery by means of actual measurement (hereinafter, called amount learning). By obtaining periodically the amount of the power storage battery by means of the amount learning and reflecting the obtained amount of the power storage battery into the estimation method of the residual amount of the power storage battery, it becomes possible to obtain the residual amount of the power storage battery with high accuracy.

For example, a patent document 1 proposes an amount learning method in which if a command for performing the amount learning is issued by a user, the power consumption by a system including the power storage battery is maximized, whereby the full discharge of the power storage battery is quickly performed.

CITATION LIST

Patent Literature

Patent Document 1: JP-A-2000-60020

SUMMARY OF INVENTION

Technical Problem

According to the amount learning method proposed in the patent document 1, it is possible to perform quickly the amount learning at any timing. However, to perform quickly the full discharge of the power storage battery, there is a case where it is impossible to avoid consuming the power wastefully, which becomes a problem. Further, if the full discharge is performed immediately before a timing when a discharge of the power storage battery becomes necessary, it becomes hard to perform the discharge of the power storage battery at the timing as scheduled. Because of this, the leveling of the power consumption is discouraged, and it becomes hard to achieve reduction in the power rate and reduction in the amount of carbon dioxide emission, which becomes a problem.

Accordingly, it is an object of the present invention to provide a power supplying system that optimizes the timing for performing the amount learning of a power storage battery.

Advantageous Effects of Invention

According to the structure of the present invention, the full charge and the full discharge of the power storage portion are performed in accordance with the operation schedule of the facility. Because of this, it becomes possible to optimize the timing for performing the amount learning of the power storage portion.

The significance and effects of the present invention will be more apparent from description of embodiments described below. Here, the following embodiments are each a mere embodiment of the present invention and the present invention and the meaning of a term of each constituent element are not limited to those described in the following embodiments.

DESCRIPTION OF EMBODIMENTS

A power supplying system according to an embodiment of the present invention is hereinafter described with reference to drawings.

<<Power Supplying System Structure>>

Figure 1:
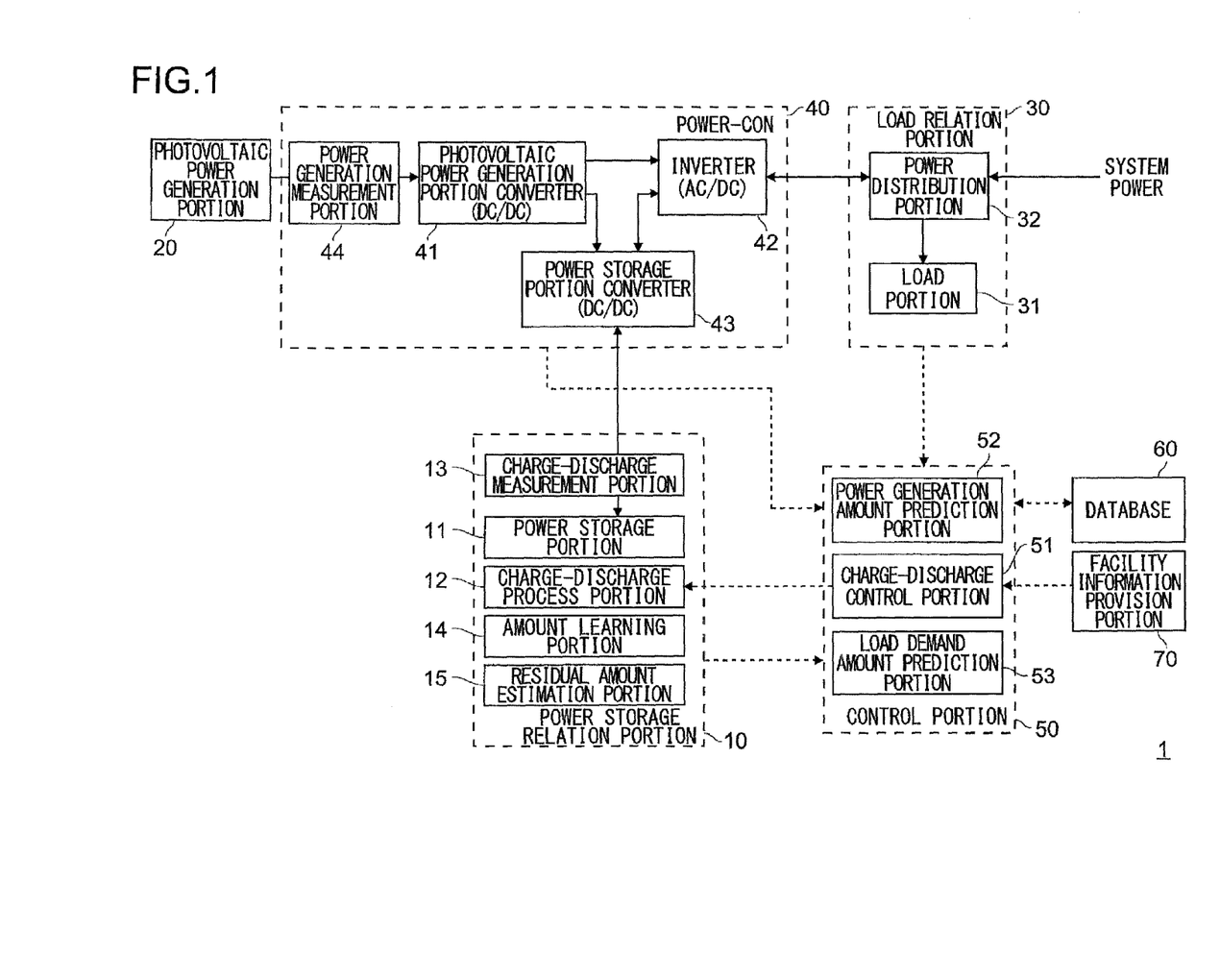
[FIG. 1] is a block diagram showing a structural example of a power supplying system according an embodiment of the present invention.

First, a structural example of the power supplying system according to the embodiment of the present invention is described with reference to drawings. FIG. 1 is a block diagram showing the structural example of the power supplying system according the embodiment of the present invention. Here, a solid-line arrow connecting blocks in the figure to one another shows a power flow, while a broken-line arrow shows an information flow.

The power supplying system 1 shown in FIG. 1 includes: a power storage relation portion 10 that includes a power storage portion 11 which stores supplied power by means of a charge and supplies the power by means of a discharge; a photovoltaic power generation portion 20 that supplies power by means of photovoltaic power generation; a load relation portion 30 that includes a load portion 31 which consumes power; a power conditioner (hereinafter, called a power-con) 40 that adjusts power transmission and reception; a control portion 50 that controls operation of each portion; a database 60 that records various kinds of information which the control portion 50 is able to obtain; and a facility information provision portion 70 that inputs facility information, which represents the current time and an operation schedule of a facility (e.g., a store, a building, a factory and the like that are likely to consume power as a whole) which is provided with the load portion 31 and the like, into the control portion 50.

The power storage relation portion 10 includes: the power storage portion 11; a charge-discharge process portion 12 that performs the charge and the discharge of the power storage portion 11; a charge-discharge measurement portion 13 that measures power or electric current charged into the power storage portion 11 and power or electric current discharged from the power storage portion 11; an amount learning portion 14 that obtains an amount of the power storage portion 11 by means of the amount learning; and a residual amount estimation portion 15 that estimates a residual amount of the power storage portion 11 based on the amount of the power storage portion 11 obtained by the amount learning portion 14 and the measurement result by the charge-discharge measurement portion 13.

The power storage portion 11 includes, for example, a large-capacity power storage battery and undergoes the charge and the discharge performed by the charge-discharge process portion 12. The charge-discharge measurement portion 13 measures a power amount or an electric-current amount that is charged into the power storage portion 11 during a unit time (e.g. one minute) and a power amount or an electric-current amount that is discharged from the power storage portion 11 during the unit time. Here, information (hereinafter, called charge-discharge information), which represents the result measured by the charge-discharge measurement portion 13, can be input into the control portion 50.

The amount learning portion 14 obtains the amount of the power storage portion 11 from an integrated value of power or electric current that is discharged from a state (e.g., a state immediate before an overcharge state in which an irreversible reaction occurs, or a state in which a charge is performed to a state which has a predetermined margin with respect to the immediate-before state. Hereinafter, the same applies) in which the power storage portion 11 is fully charged to a state (e.g, a state immediate before an overdischarge state in which an irreversible reaction occurs, or a state in which a discharge is performed to a state which has a predetermined margin with respect to the immediate-before state. Hereinafter, the same applies) in which the power storage portion 11 is fully discharged. The integrated value is obtainable from the measurement result by the charge-discharge measurement portion 13.

The full charge and the full discharge of the power storage portion 11 are performed in turn. Here, to the contrary to the above obtaining order, the amount learning portion 14 may obtain the amount of the power storage portion 11 from power or electric current that is charged from a state in which the power storage portion 11 is fully discharged to a state in which the power storage portion 11 is fully charged. Besides, by dividing at least one of the full charge and the full discharge of the power storage portion 11 into a plurality of sections and performing the sections, the power storage portion 11 may be brought to the state in which the power storage portion 11 is fully charged or fully discharged. However, in a case where either one to be performed later of the full charge and the full discharge is divided into a plurality of sections and performed, if an opposite operation (the discharge in the case where the full charge is later, divided into the plurality of sections and performed, or the charge in the case where the full discharge is later, divided into the plurality of sections and performed) is prevented from being performed between the divided operations, it is possible to obtain the amount of the power storage portion 11 with high accuracy, which is accordingly preferable. Besides, information (hereinafter, called amount information), which represents the amount obtained by the amount learning portion 14, can be input into the control portion 50.

The residual amount estimation portion 15 uses the amount of the power storage portion 11 obtained from the amount learning portion 14 as a reference, and adds (during the charge time span) or subtracts (during the discharge time span) the integrated value of the power or the electric current measured by the charge-discharge measurement portion 13, thereby estimating a residual amount of the power storage portion 11. Here, the residual amount estimation portion 15 may include a table that represents a relationship between the voltage value of the power storage portion 11 and the residual amount of the power storage portion 11, measure the voltage value of the power storage portion 11 and refer to the table to estimate the residual amount of the power storage portion 11. In this case, the amount of the power storage portion 11 obtained from the amount learning portion 14 may be reflected into the value of the table. Besides, information (hereinafter, called residual amount information), which represents the amount estimated by the residual amount estimation portion 15, can be input into the control portion 50.

The photovoltaic power generation portion 20 includes, for example, a photovoltaic power generation panel that is disposed outdoors, and converts pouring sunlight (sunshine) into power, thereby performing power generation.

The load relation portion 30 includes the load portion 31 and a power distribution portion 32 that supplies supplied power to the load portion 31 when necessary. Here, at least one of the load portion 31 and the power distribution portion 32 is able to measure the power amount or the electric current amount per unit time (e.g., one minute) that is supplied to the load portion 31 and consumed. Here, information (hereinafter, called load demand amount information), which represents the result measured by at least one of the load portion 31 and the power distribution portion 32, can be input into the control portion 50.

The load portion 31 includes a plurality of apparatuses (loads) that consume the supplied power. For example, the apparatuses can include: an illumination apparatus such as a light and the like; an air conditioner; a cooler and a warmer; an EV charge apparatus that charges a battery for driving an electric vehicle and the like. The power distribution portion 32 selectively supplies the system power or the power supplied from the power-con 40 to each load that composes the load portion 31.

The power-con 40 includes: a photovoltaic power generation portion converter 41 that converts input d.c. power into predetermined d.c. power and outputs it; an inverter 42 that converts input a.c. power or d.c. power into predetermined d.c. power or a.c. power and outputs it; a power storage portion converter 43 that converts input d.c. power into predetermined d.c. power and outputs it; and a power generation measurement portion 44 that measures the power or the electric current that is generated and supplied from the photovoltaic power generation portion 20.

The photovoltaic power generation portion converter 41 converts the d.c. power supplied from the photovoltaic power generation portion 20 into d.c. power that is suitable for processes by the inverter 42 and the power storage portion converter 43 and outputs it. The inverter 42 converts the a.c. system power input via the power distribution portion 32 into the d.c. power that is suitable for the process by the power storage portion converter 43. Besides, the inverter 42 converts the d.c. power output from the photovoltaic power generation portion converter 41 and the d.c. power output from the power storage portion converter 43 into a.c. power that is suitable for the processes by the power distribution portion 32 and the load portion 31, and outputs it to the power distribution portion 32. The power storage portion converter 43 converts the d.c. power output from the photovoltaic power generation portion converter 41 and the d.c. power output from the inverter 42 into d.c. power that is suitable for the charge of the power storage portion 11, and outputs it to the power storage portion 11. Besides, the power storage portion converter 43 converts the d.c. power supplied by the discharge of the power storage portion 11 into d.c. power suitable for a process by the inverter 42 and outputs it. The power generation measurement portion 44 measures the power amount or the electric current amount per unit time (e.g., one minute) of the d.c. power that is output from the photovoltaic power generation portion 20 and input into the photovoltaic power generation portion converter 41. Here, information (hereinafter, called power generation amount information), which represents the result measured by the power generation measurement portion 44, can be input into the control portion 50.

The control portion 50 includes: a charge-discharge control portion 51 that controls operation of the charge-discharge process portion 12; a power generation amount prediction portion 52 that predicts a power amount generated by the photovoltaic power generation portion 20; and a load demand amount prediction portion 53 that predicts a power amount that is supplied to the load portion 31 to be consumed. Here, a portion or all portions of the control portion 50 may be disposed in the power-con 40 or may be disposed independent of the power-con 40.

Besides, the control portion 50 records each piece of information input as described above into the database 60 when necessary. Besides, the control portion 50 reads the information recorded in the database 60 when necessary. Here, the database 60 may be able to record each piece of information that is generated by an external device such as another power supplying system.

Based on the power amount (hereinafter, called a power generation amount) that is predicted by the power generation amount prediction portion 52 and generated by the photovoltaic power generation portion 20 or based on the power amount (hereinafter, called a load demand amount) that is predicted by the load demand amount prediction portion 53 and consumed by the load portion 31, the charge-discharge control portion 51 decides timings for charging and discharging the power storage portion 11 and controls the charge-discharge process portion 12. In this way, the charge and the discharge of the power storage portion 11 for achieving the leveling of the power consumption are performed.

Besides, although a specific example is described later, based on the load demand amount predicted by the load demand amount prediction portion 53 and the facility information obtained from the facility information provision portion 70, the charge-discharge control portion 51 decides timings (timings for performing the full charge and the full discharge of the power storage portion 11 and the like) for performing the amount learning.

The power generation amount prediction portion 52 and the load demand amount prediction portion 53 are able to refer to not only the power generation amount information and the load demand amount information obtained during the prediction time but also the information (e.g., power amount information and load demand amount information that are obtained and recorded in the past and information obtained by statistically processing (e.g., averaging for a predetermined time span such as one week, one month and the like) these pieces of information) recorded in the database 60. And, by referring to these pieces of information, the power generation amount prediction portion 52 and the load demand amount prediction portion 53 predict the power generation amount and the load demand amount.

Here, the structure of the power supplying system 1 shown in FIG. 1 is a mere example, and may be another structure. For example, a structure may be employed, which instead of the inverter 42, includes: a photovoltaic power generation portion inverter that converts the d.c. power output from the photovoltaic power generation portion converter 41 into the a.c. power and inputs it into the power distribution portion 32; and a power storage portion inverter that converts the d.c. power output from the power storage portion converter 43 into the a.c. power and inputs it into the power distribution portion 32 and converts the a.c. power input via the power distribution portion 32 into the d.c. power and inputs it into the power storage portion converter 43. Further, a structure may be employed, which instead of the power storage portion inverter, includes: a discharge inverter that converts the d.c. power output from the power storage portion converter 43 into the a.c. power and inputs it into the power distribution portion 32; and a charge inverter that converts the a.c. power input via the power distribution portion 32 into the d.c. power and inputs it into the power storage portion converter 43.

Besides, the inclination relationship among the blocks is a mere example for the sake of description, and may be another relationship. For example, the charge-discharge measurement portion 13 and the charge-discharge process portion 12 may be included in the power-con 40 (may not be included in the power storage relation portion 10). Besides, for example, the power storage portion converter 43 may be included in the power storage relation portion 10 (may not be included in the power-con 40). Besides, for example, the power generation measurement portion 44 may be included in the photovoltaic power generation portion 20 (may not be included in the power-con 40). Besides, for example, the amount learning portion 14 and the residual amount estimation portion 15 may be included in the control portion 50 (may not be included in the power storage relation portion 10).

Besides, the control portion 50 may obtain information (e.g., presence of sunlight, temperature, humidity, precipitation and the like) about the current or later weather via a network and the like, and may include an observation apparatus that generates information about weather and obtain the information about weather from the observation apparatus. Besides, the control portion 50 may record the obtained information about weather into the database 60. Besides, the control portion 50 may generate information about time and obtain the information from the facility information provision portion 70, and may record the generated or obtained information about time into the database 60. According to this structure, it also becomes possible for the power generation amount prediction portion 52 and the load demand amount prediction portion 53 to perform a prediction based on the weather and time. Because of this, it becomes possible to perform the prediction with higher accuracy.

Besides, instead of (or in addition to) the photovoltaic power generation portion 20 that supplies the power by means of the photovoltaic power generation, a power generation portion (e.g., a fuel battery, a power generator and the like) which supplies the power by means of another method may be included, and a structure may be employed, which does not include the power generation portion and the photovoltaic power generation portion 20. Besides, the power storage relation portion 10 may include: a temperature adjustment portion that includes an air cooling fan, an air conditioner and the like which adjust the temperature of a space where the power storage portion 11 is disposed; and a temperature sensor that includes a thermistor, a thermocouple and the like which detect the temperature of the space, and may perform temperature adjustment of the power storage portion 11.

Besides, the facility information provision portion 70 may be a recording apparatus in which an operation schedule input beforehand by a user is recorded. Besides, the facility information provision portion 70 may be an operation apparatus in which the user inputs the operation schedule when necessary, for example, when determining the timing for performing the full charge and the full discharge.

<<Amount Learning>>

Figure 2:
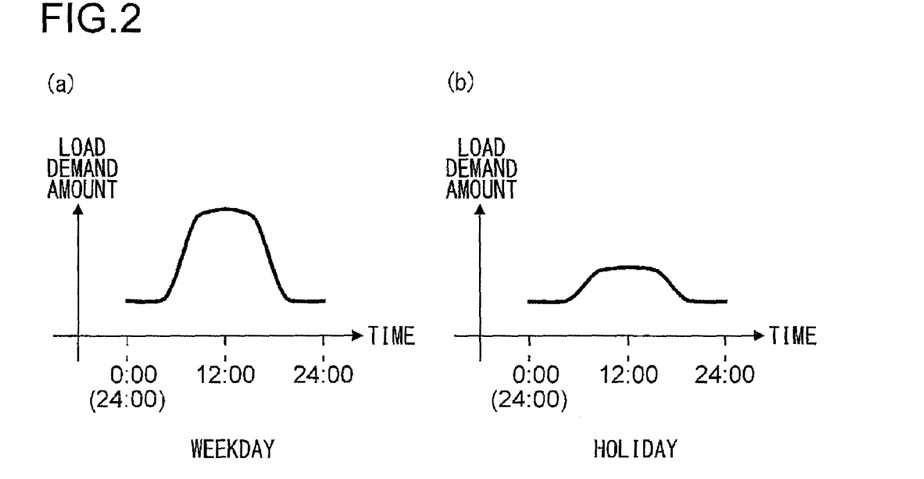
[FIG. 2] is a graph showing a load demand amount of a load portion that is disposed in a facility.

Next, an operation example of the amount learning by the power supplying system 1 shown in FIG. 1 is described with reference to drawings. First, the load demand amount of the load portion 31 disposed in the facility is described with reference to drawings. FIG. 2 is a graph showing the load demand amount of the load portion disposed in the facility, in which a horizontal axis represents the time and a vertical axis represents the load demand amount. Besides, FIG. 2 (*a*) is a graph showing the load demand amount during a weekday (operation day) of the facility, while FIG. 2 (*b*) is a graph showing the load demand amount during a holiday (non-operation day) of the facility.

As shown in FIGS. 2 (*a*) and (*b*), in both of the weekday and the holiday, the load demand amount during the daytime (before and after 12 o'clock) is large, while the load demand amount during the night (before and after 24 o'clock) is small. However, the load demand amount per day is larger during the weekday than during the holiday. Besides, the maximum (peak) load demand amount per unit time and the change size in the load demand amount per unit time are also larger during the weekday than during the holiday. Because of this, necessity for the charge and the discharge of the power storage portion 11 for achieving the leveling of the power consumption is likely to become higher during the weekday than during the holiday. Besides, the effect obtained in the case of performing the leveling of the power consumption is likely to become larger during the weekday than during the holiday.

Hereinafter, on assumption that the load demand amount of the load portion 31 disposed in the facility is shown in FIG. 2, each operation example of the amount learning of the power supplying system 1 is specifically described. However, FIG. 2 is a mere example, and the present invention is applicable to whatever load demand amount (e.g., even if the peak position is different from FIG. 2). Besides, each operation example of the amount learning described hereinafter is executable with combined with one another as long as there is no discrepancy.

Besides, among the operation examples of the amount learning described hereinafter, there is an operation example in which the timing for performing the amount learning is decided based on the operation time span of the facility (a time span during which the load demand amount per unit time is large) and the non-operation time span (a time span during which the load demand amount per unit time is small). Such operation example is described specifically on assumption that the unit time is one day of 0 o'clock to 24 o'clock; and the weekday shown in FIGS. 2 (*a*) and the holiday shown in FIG. 2 (*b*) correspond to the operation time span and the non-operation time span, respectively. However, the setting method of the unit time is not limited to this example. For example, the unit time may be set at one day of 5 o'clock to 29 o'clock (5 o'clock of the next day), or may be set at a few hours or a few days. However, as shown in FIGS. 2 (*a*) and (*b*), it is preferable that the unit time is set such that the load demand amount during the operation time span and the load demand amount during the non-operation time span become contrastive to each other. Besides, many facilities are controlled over the presence of operation in units of one day, accordingly, it is preferable to set the unit time at one day.

<First Operation Example>

Figure 3:
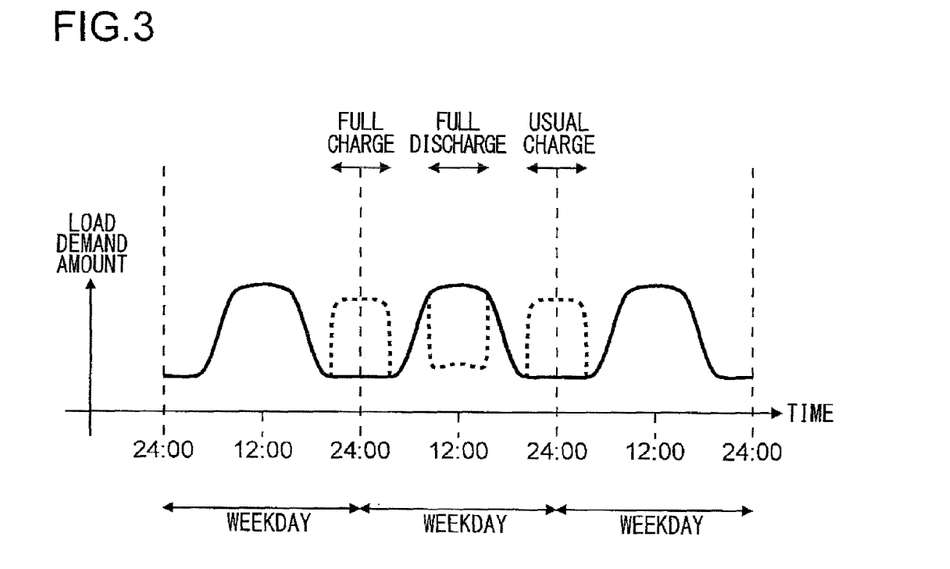
[FIG. 3] is a graph showing a first operation example of the amount learning.

A first operation example of the amount learning is described with reference to drawings. FIG. 3 is a graph showing the first operation example of the amount learning. A vertical axis and a horizontal axis of the graph shown in FIG. 3 are the same as the graph shown in FIG. 2. Besides, a solid line of the graph shown in FIG. 3 represents the same load demand amount as FIG. 2, while a broken line of the graph shown in FIG. 3 represents a value obtained by adding a power amount needed by the amount learning to the load demand amount (case of becoming higher than the solid line) or a value obtained by subtracting an unnecessary power amount from the load demand amount (case of becoming lower than the solid line).

The operation example shown in FIG. 3 illustrates a case where the facility has no holiday. In this case, the full discharge of the power storage portion 11 is performed during the daytime of a weekday during which the load demand amount is predicted to become large. Besides, the full charge is performed during the night immediate before the daytime during which the full discharge is performed.

Besides, during a night immediately after the daytime during which the full discharge is performed, to prepare for the discharge during the next day, that is, a weekday, the charge (hereinafter, called a usual charge) of the power storage portion 11 is performed. As described above, if the usual charge is performed after the full discharge of the power storage portion 11 and by the daytime of the immediate-after weekday, it is possible to put the power storage portion 11 into a dischargeable state before a time zone where the necessity for the discharge is high, which is accordingly preferable.

According to the above structure, the full charge and the full discharge of the power storage portion 11 are performed in accordance with the operation schedule of the facility. Because of this, it becomes possible to optimize the timing for performing the amount learning of the power storage portion 11.

Further, by performing the full discharge at the above timing, it is possible to achieve the leveling of the power consumption. Because of this, it becomes possible to achieve reduction in the power rate and reduction in the amount of carbon dioxide emission. Besides, by performing the full charge and the usual charge at the above timing, it is possible to use the night system power whose price per unit power is inexpensive.

Here, in the example shown in FIG. 3, the usual charge is performed during the night of the weekday; however, the usual charge may be performed by the night of the weekday (in other words, earlier than the timing shown in FIG. 3). Here, the power charged in the power storage portion 11 can be used as an emergency power supply source during a supply suspension time of the system power due to a disaster and the like. Because of this, by performing the usual charge after the full discharge and by the night, it becomes possible to supply the power to the illumination apparatus and the other loads during the supply suspension time of the night system power.

<Second Operation Example>

Figure 4:
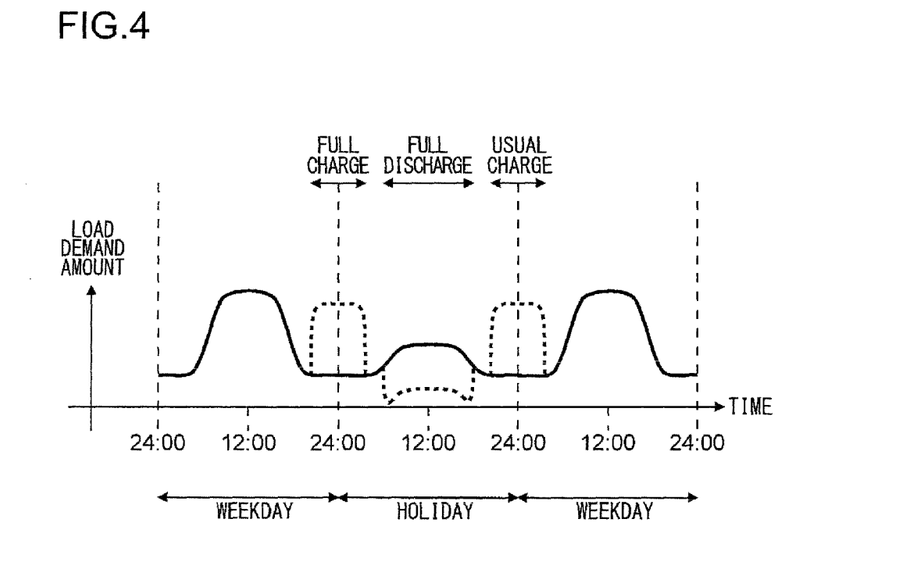
[FIG. 4] is a graph showing a second operation example of the amount learning.

Next, a second operation example of the amount learning is described with reference to drawings. FIG. 4 is a graph showing the second operation example of the amount learning, and is the same as FIG. 3 that shows the first operation example. Here, in FIG. 4 and description of the present operation example, the same portions as FIG. 3 and the description of the first operation example are not described.

The second operation example shown in FIG. 4 illustrates a case where the facility has a holiday. In the present operation example, the charge-discharge control portion 51 prioritizes the holiday as the timing for performing the full discharge of the power storage portion 11. Because of this, in the present operation example, it is assumed that the full discharge of the power storage portion 11 is performed during the daytime of the holiday. Besides, the load demand amount during the daytime of the holiday is smaller than the load demand amount during the daytime of a weekday. Because of this, in the present operation example, it is assumed that the power amount discharged for the unit time of the full discharge time duration is smaller than the first operation example and the discharge time duration is longer than the first operation example. Besides, in the present operation example, like the first operation example, it is assumed that the full charge and the usual charge are performed during a night.

According to the above structure, like the first operation example, the full charge and the full discharge of the power storage portion 11 are performed in accordance with the operation schedule of the facility. Because of this, it becomes possible to optimize the timing for performing the amount learning of the power storage portion 11.

Further, by performing the full discharge at the above timing, the full discharge is performed during the holiday in which the necessity for the usual-time charge and discharge is likely to become low. Because of this, by performing the amount learning, it becomes possible to alleviate the fulfillment of the usual-time charge and discharge becoming hard (e.g., the discharge of the power storage portion 11 is limited) during a weekday in which the necessity for the usual-time charge and discharge is likely to become high. Besides, by performing the full charge and the usual charge at the above timing, it is possible to use the night system power whose price per unit power is inexpensive.

Here, in the present operation example, it is assumed that the power amount discharged for the unit time of the full discharge time duration is smaller than the first operation example and the discharge time duration is longer than the first operation example; however, if possible, the full discharge may be performed with the same power amount and time duration as the first operation example.

Figure 5:
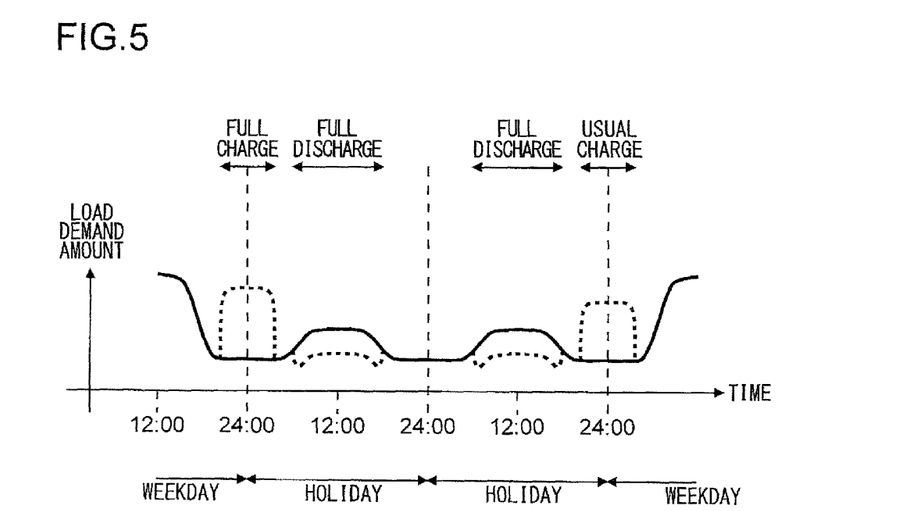
[FIG. 5] is a graph showing another example of the second operation example of the amount learning.

Besides, in a case where there are two or more consecutive holidays, the full discharge may be performed for the two or more days (e.g., see FIG. 7), or may be divided into two or more sections and performed. An operation example of the latter case is described with reference to FIG. 5. FIG. 5 is a graph showing another example of the second operation example of the amount learning, and the same as FIG. 4. Here, in FIG. 5 and description of the present another example, the same portions as FIG. 4 and its description are not described.

In the present another example, the full discharge is performed during each of respective daytimes of the two consecutive holidays. According to this, it becomes possible to divide the power amount, which has to be discharged to perform the full discharge, into two days. In other words, it becomes possible to make the power amount per day discharged for the full discharge less than a case where the full discharge is performed and completed during one day. However, it is assumed that the power or the electric current discharged during each of the two holidays is large to be measurable by the charge-discharge measurement portion 13.

According to this structure, even in a case where the load demand amount during the holiday is small and it is hard to complete the full discharge during one day, it becomes possible to perform the full discharge. Besides, during the holiday, the necessity for the usual-time charge and discharge is likely to become low, accordingly, it is possible to flexibly perform the full discharge for the amount learning.

Besides, based on the facility information and the load demand amount information, the charge-discharge control portion 51 may decide whether to perform the full discharge during one holiday or perform the full discharge during two or more holidays. For example, in a case where the charge-discharge control portion 51 determines that the load demand amount during the holiday is large enough to perform the full discharge during one day, the charge-discharge control portion 51 may decide to perform the full discharge during one day. Besides, even in a case where the charge-discharge control portion 51 determines that the load demand amount during the holiday is not large enough and it is hard to perform the full discharge during one day, in a case where two or more consecutive holidays are confirmed and it is determined that it is possible to perform the full discharge if the discharge is performed during the two or more holidays, the charge-discharge control portion 51 may decide to perform the full discharge during the two or more holidays.

<Third Operation Example>

Figure 6:
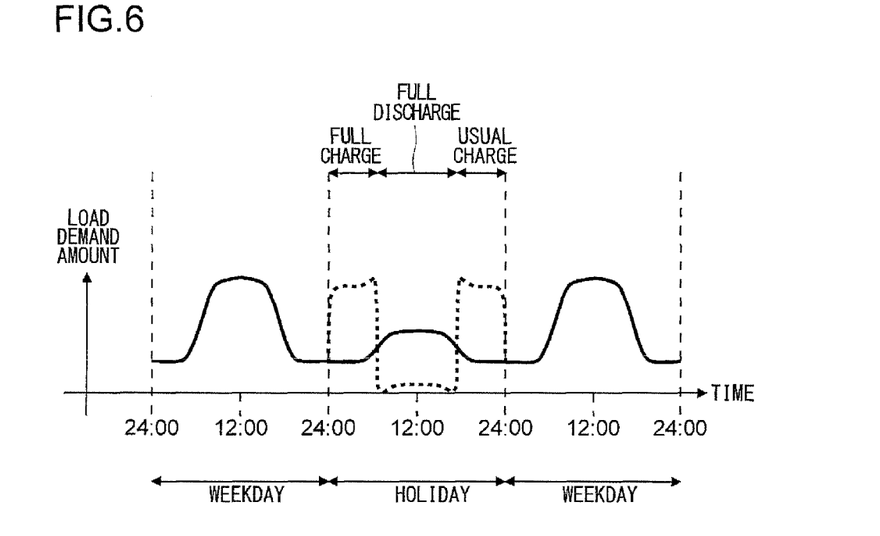
[FIG. 6] is a graph showing a third operation example of the amount learning.

Next, a third operation example of the amount learning is described with reference to drawings. FIG. 6 is a graph showing the third operation example of the amount learning, and is the same as FIG. 4 that shows the second operation example. Here, in FIG. 6 and description of the present operation example, the same portions as FIG. 4 and the description of the second operation example are not described.

The third operation example shown in FIG. 6 is the same as the second operation example in that the charge-discharge control portion 51 prioritizes a holiday as the timing for performing the full discharge of the power storage portion 11; the full discharge is performed during the daytime of the holiday; and the full charge and the usual charge are performed during a night. However, it is different from the second operation example in that the full charge and the usual charge are started and ended during the holiday.

According to the above structure, like the first operation example and the second operation example, the full charge and the full discharge of the power storage portion 11 are performed in accordance with the operation schedule of the facility. Because of this, it becomes possible to optimize the timing for performing the amount learning of the power storage portion 11.

Further, by performing the full discharge at the above timing, the full discharge is performed during the holiday in which the necessity for the usual-time charge and discharge is likely to become low. Because of this, by performing the amount learning, it becomes possible to alleviate the fulfillment of the usual-time charge and discharge becoming hard (e.g., the discharge of the power storage portion 11 is limited) during a weekday in which the necessity for the usual-time charge and discharge is likely to become high. Besides, by performing the full charge and the usual charge at the above timing, it is possible to use the night system power whose price per unit power is inexpensive.

Besides, by performing the full discharge, the full charge and the usual charge at the above timing, it is possible to complete the amount learning and its post-process during the holiday. Because of this, it becomes possible to perform the amount learning without discouraging the usual-time charge and discharge during the weekday (especially, the next day and the previous day of the holiday during which the amount learning is performed).

Figure 7:
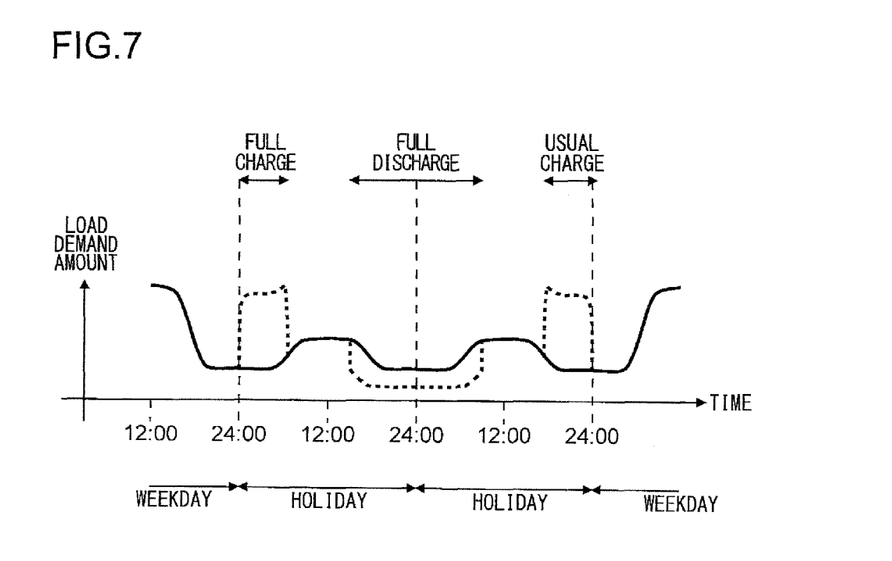
[FIG. 7] is a graph showing another example of the third operation example of the amount learning.

Besides, in a case where there are two or more consecutive holidays, the full discharge may be divided into two or more sections and performed (e.g., see FIG. 5), or may be performed for the two or more days (e.g., see FIG. 7). An operation example of the latter case is described with reference to FIG. 7. FIG. 7 is a graph showing another example of the third operation example of the amount learning, and the same as FIG. 6. Here, in FIG. 7 and description of the present another example, the same portions as FIG. 6 and its description are not described.

In the present another example, the full discharge is performed during the two consecutive holidays. According to this, it becomes possible to divide the power amount, which has to be discharged to perform the full discharge, into two days. In other words, it becomes possible to make the power amount per day discharged for the full discharge less than a case where the full discharge is performed during one day. However, it is assumed that the power or the electric current discharged during each of the two holidays is large to be measurable by the charge-discharge measurement portion 13.

According to this structure, even in a case where the load demand amount during the holiday is small and it is hard to complete the full discharge during one day, it becomes possible to perform the full discharge. Besides, during the holiday, the necessity for the usual-time charge and discharge is likely to become low, accordingly, it is possible to flexibly perform the full discharge for the amount learning.

Besides, based on the facility information and the load demand amount information, the charge-discharge control portion 51 may decide whether to perform the full discharge during one holiday or perform the full discharge during two or more holidays. For example, in a case where the charge-discharge control portion 51 determines that the load demand amount during the holiday is large enough to perform the full discharge during one day, the charge-discharge control portion 51 may decide to perform the full discharge during one day. Besides, for example, even in a case where the charge-discharge control portion 51 determines that the load demand amount during the holiday is not large enough and it is hard to perform the full discharge during one day, in a case where two or more consecutive holidays are confirmed and it is determined that it is possible to perform the full discharge if the discharge is performed during the two or more holidays, the charge-discharge control portion 51 may decide to perform the full discharge during the two or more holidays.

<Fourth Operation Example>

Figure 8:
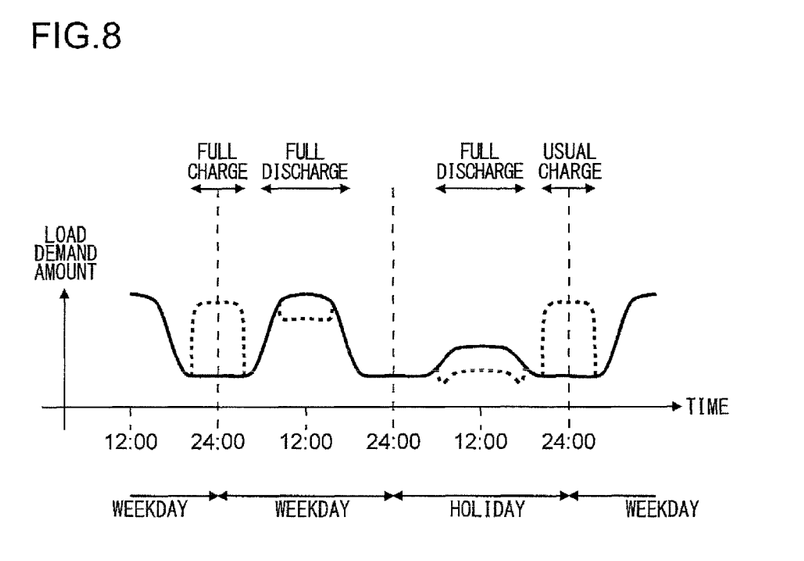
[FIG. 8] is a graph showing a fourth operation example of the amount learning.

An operation example is described hereinafter with reference to drawings, in which in the above second operation example and third operation example, the load demand amount during the holiday is small and it is hard to perform the full discharge during one day and there are not two or more consecutive holidays. FIG. 8 is a graph showing a fourth operation example of the amount learning, and is the same as FIG. 4 that shows the second operation example. Here, in FIG. 8 and description of the present operation example, the same portions as FIG. 4 and the description of the second operation example are not described.

In the fourth operation example shown in FIG. 8, like the second operation example and the third operation example, the charge-discharge control portion 51 prioritizes a holiday as the timing for performing the full discharge of the power storage portion 11. However, as described above, there is only one holiday and it is hard to perform the full discharge during the holiday only. Accordingly, in the present operation example, by dividing the discharge into the daytime of the holiday and the daytime of the previous day of the holiday, that is a weekday, and performing the discharge, the full discharge is performed.

Besides, the full charge is performed during a night immediate before the daytime of the weekday during which a discharge forming a portion of the full discharge is performed. Besides, the usual charge is performed during a night immediate after the daytime of the holiday during which a discharge forming a portion of the full discharge is performed.

According to the above structure, like the first operation example to the third operation example, the full charge and the full discharge of the power storage portion 11 are performed in accordance with the operation schedule of the facility. Because of this, it becomes possible to optimize the timing for performing the amount learning of the power storage portion 11.

Further, even in a case and the like where the load demand amount during the holiday is small and it is hard to perform the full discharge during one day, by performing the full discharge at the above timing, it becomes possible to perform the full discharge. Besides, by performing the full charge and the usual charge at the above timing, it is possible to use the night system power whose price per unit power is inexpensive.

Here, like the third operation example, the full charge and the usual charge may be started and ended during the weekday and holiday during which the full discharge is performed. According to this structure, it becomes possible to perform the amount learning without discouraging the charge and discharge operations of the power storage portion 11 during a weekday (in the example shown in FIG. 8, the previous day of the weekday during which the discharge forming a portion of the full discharge is performed, and the next day of the holiday during which the discharge forming a portion of the full discharge is performed).

Besides, based on the facility information and the load demand amount information, the charge-discharge control portion 51 may decide whether to perform the present operation example or not. For example, in a case where the charge-discharge control portion 51 determines that the load demand amount during the holiday is not large enough and it is hard to perform the full discharge during one day, in a case where two or more consecutive holidays are not confirmed, the charge-discharge control portion 51 may decide to perform the present operation example.

Besides, the example is described, in which by performing the discharge in the order of the weekday, then, the holiday, the full discharge is performed; however, by performing the discharge in an order of the holiday, then, the weekday, the full discharge may be performed. However, like the former case, if the discharge during the weekday is performed ahead, it becomes possible to secure a residual amount of the power storage portion 11 after the discharge during the weekday. Because of this, in a case where a sudden discharge is needed during the weekday, or during an emergency time span in which the system power supply is suspended, it becomes possible to deal with the cases by discharging the power storage portion 11.

Besides, like the operation example shown in FIG. 7, the full discharge may be performed during the weekday and the holiday. Besides, in the first operation example, even in a case where it is hard to perform the full discharge during one weekday, like the present operation example, the full discharge may be performed during two or more weekdays (see FIG. 7 and FIG. 8).

<<Modification Examples>>

In each of the above operation examples, the case is described, where the full discharge is performed after the full charge of the power storage portion 11; however, as described above, even in a case where the full charge is performed after the full discharge of the power storage portion 11, it is possible to perform the amount learning. In this case, without performing the full charge in each of the above operation examples, the full charge may be performed instead of the usual charge in each of the above operation examples.

Besides, in a case where it is hard to perform the full charge during one day (e.g., a case where the maximum power amount per unit time of the system power is updated by performing the full charge, a case where it becomes necessary to perform the charge during not only a night but also a daytime and the like), like the full discharge in each of the above operation examples, the full charge may be performed during two or more days (see FIG. 5 and FIG. 7). However, like each of the above operation examples, it is preferable to perform the full discharge during a night.

In the power supplying system 1 according the embodiment of the present invention, the operation of a portion or of all portions of the power storage relation portion 10 and the control portion 50 may be performed by a control apparatus such as a microcomputer and the like. Further, all portions or a portion of the function achieved by such a control apparatus may be written as a program, and by executing the program on a program execution apparatus (e.g., a computer), the all portions or a portion of the function may be achieved.

To achieve the above object, a power supplying system that supplies power to a load disposed in a facility, comprising: a power storage portion that stores power by means of a charge and supplies the power by means of a discharge; and an amount measurement portion that performs a full charge and a full discharge of the power storage portion to measure an amount of the power storage portion, wherein the amount measurement portion obtains an operation schedule of the facility, and decides a timing for performing the full charge and the full discharge of the power storage portion based on the operation schedule.

In the following embodiments, as examples of the amount measurement portion, a charge-discharge control portion, a charge-discharge process portion, a charge-discharge measurement portion and an amount learning portion are described.

Besides, the power supplying system having the above structure may further include a facility information provision portion that provides the operation schedule of the facility to the amount measurement portion. Besides, in the power supplying system having the above structure, the amount measurement portion may measure the amount of the power storage portion by measuring at least one of power and electric current that are discharged from a time when the power storage portion is fully charged to a time when the power storage portion is fully discharged, or by measuring at least one of power and electric current that are charged from a time when the power storage portion is fully discharged to a time when the power storage portion is fully charged.

Besides, in the power supplying system having the above structure, the facility may have an operation time span during which a power amount consumed by the load for a unit time is large and a non-operation time span during which the power amount consumed by the load for the unit time is small; and the amount measurement portion may prioritize the non-operation time span as the timing for performing the full discharge of the power storage portion.

According to this structure, the full discharge is performed during the non-operation time span in which necessity for the charge and the discharge of the power storage portion for achieving the leveling of the power consumption is likely to become low. Because of this, by performing the amount learning, it becomes possible to alleviate the fulfillment of the charge and discharge becoming hard (e.g., the discharge of the power storage portion is limited) during the operation time span in which the necessity for the charge and the discharge of the power storage portion for achieving the leveling of the power consumption is likely to become high.

Besides, the power supplying system having the above structure may further include a load demand amount prediction portion that predicts the power amount consumed by the load, wherein in a case where it is predicted by the load demand amount prediction portion that the power amount consumed by the load for one non-operation time span becomes smaller than the power amount supplied by the full discharge of the power storage portion, the amount measurement portion may perform the full discharge of the power storage portion during the one non-operation time span and during at least one of another non-operation time span and another operation time span.

According to this structure, even in a case where the load demand amount during the non-operation time span is small and the full discharge is hard for the time span, it becomes possible to perform the full discharge.

Besides, in the power supplying system having the above structure, the amount measurement portion may start and end the full charge and the full discharge of the power storage portion during one non-operation time span or during a plurality of consecutive non-operation time spans.

According to this structure, it is possible to complete the amount learning during the nonoperation time span. Because of this, it becomes possible to perform the amount learning without discouraging the charge and the discharge of the power storage portion for achieving the leveling of the power consumption for the operation time span.

Besides, the power supplying system having the above structure may include a load demand amount prediction portion that predicts the power amount consumed by the load, wherein the amount measurement portion may perform the full discharge after the full charge of the power storage portion; and the power storage portion may be charged after the full discharge and before a time zone, which is in an operation time span immediate after the full discharge, where it is predicted by the load demand amount prediction portion that the power amount consumed by the load for the unit time becomes larger than other ones.

According to this structure, it is possible to put the power storage portion into a dischargeable state before the time zone which has a high possibility that the discharge is needed.

Besides, in the power supplying system having the above structure, the amount measurement portion may perform the full charge, the full discharge and the charge of the power storage portion in this order during one non-operation time span or during a plurality of consecutive non-operation time spans and may start and end each of them during the time span.

According to this structure, it is possible to complete the amount learning and its postprocess during the non-operation time span. Because of this, it becomes possible to perform the amount learning without discouraging the charge and the discharge of the power storage portion for achieving the leveling of the power consumption for the operation time span.

Besides, the power supplying system having the above structure may include the load demand amount prediction portion that predicts the power amount consumed by the load, wherein the amount measurement portion may perform the full charge of the power storage portion during a time zone where it is predicted by the load demand amount prediction portion that the power amount consumed by the load for the unit time becomes small; and the amount measurement portion may perform the full discharge of the power storage portion during a time zone where it is predicted by the load demand amount prediction portion that the power amount consumed by the load for the unit time becomes large.

According to this structure, it is possible to achieve the leveling of the power consumption. Because of this, it becomes possible to achieve reduction in the power rate and reduction in the amount of carbon dioxide emission.

In addition, also in other cases other than the above cases, it is possible to achieve the power supplying system 1 shown in FIG. 1 by means of hardware or a combination of hardware and software. Besides, in a case where a portion of a charge system is composed by using software, a block of each portion achieved by the software shows a functional block of the portion.

The embodiments according to the present invention are described above;

however, the present invention is not limited to these embodiments: it is possible to add various alterations and put them into practice without departing from the spirit of the present invention.

INDUSTRIAL APPLICABILITY

The present invention is applicable to a power supplying system that supplies power.

REFERENCE SIGNS LIST 1 power supplying system
11 power storage portion
12 charge-discharge process portion
13 charge-discharge measurement portion
14 amount learning portion
15 residual amount estimation portion
31 load portion
51 charge-discharge control portion
53 load demand amount prediction portion
60 database
70 facility information provision portion

The invention claimed is:

1. A power supplying system that supplies power to a load disposed in a facility, comprising:
   a power storage portion that stores power by means of a charge and supplies the power by means of a discharge; and
   an amount measurement portion that performs a full charge and a full discharge of the power storage portion to measure an amount of the power storage portion, wherein
   the amount measurement portion obtains an operation schedule of the facility, and decides a timing for performing the full charge and the full discharge of the power storage portion based on the operation schedule.

2. The power supplying system according to claim 1, wherein
   the facility has an operation time span during which a power amount consumed by the load for a unit time is large and a non-operation time span during which the power amount consumed by the load for the unit time is small; and
   the amount measurement portion prioritizes the non-operation time span as the timing for performing the full discharge of the power storage portion.

3. The power supplying system according to claim 2, further comprising a load demand amount prediction portion that predicts the power amount consumed by the load, wherein
   in a case where it is predicted by the load demand amount prediction portion that the power amount consumed by the load for one non-operation time span becomes smaller than the power amount supplied by the full discharge of the power storage portion, the amount measurement portion performs the full discharge of the power storage portion during the one non-operation time span and during at least one of another non-operation time span and another operation time span.

4. The power supplying system according to claim 2, further comprising a load demand amount prediction portion that predicts the power amount consumed by the load, wherein
   the amount measurement portion performs the full discharge after the full charge of the power storage portion; and
   the power storage portion is charged after the full discharge and before a time zone, which is in an operation time span immediate after the full discharge, where it is predicted by the load demand amount prediction portion that the power amount consumed by the load for the unit time becomes larger than other ones.

5. The power supplying system according to claim 1, further comprising a load demand amount prediction portion that predicts the power amount consumed by the load, wherein the amount measurement portion performs the full charge of the power storage portion during a time zone where it is predicted by the load demand amount prediction portion that the power amount consumed by the load for the unit time becomes small; and the amount measurement portion performs the full discharge of the power storage portion during a time zone where it is predicted by the load demand amount prediction portion that the power amount consumed by the load for the unit time becomes large.

6. The power supplying system according to claim 2, wherein the amount measurement portion starts and ends the full charge and the full discharge of the power storage portion during one non-operation time span or during a plurality of consecutive non-operation time spans.

7. The power supplying system according to claim 1, wherein the amount measurement portion obtains an amount of the power storage portion based on power discharged between a state in which the power storage portion is fully charged and a state in which the power storage portion is fully discharged.

8. The power supplying system according to claim 1, wherein the amount measurement portion obtains an amount of the power storage portion based on power charged between a state in which the power storage portion is fully charged and a state in which the power storage portion is fully discharged.

* * * * *